(12) United States Patent
Wang et al.

(10) Patent No.: US 9,466,767 B2
(45) Date of Patent: Oct. 11, 2016

(54) OPTOELECTRONIC DEVICE AND METHOD FOR MANUFACTURING THE SAME

(71) Applicant: EPISTAR CORPORATION, Hsinchu (TW)

(72) Inventors: Jia-Kuen Wang, Hsinchu (TW); Chien-Fu Shen, Hsinchu (TW); Hung-Che Chen, Hsinchu (TW); Chao-Hsing Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/537,058

(22) Filed: Nov. 10, 2014

(65) Prior Publication Data

US 2015/0129869 A1    May 14, 2015

(30) Foreign Application Priority Data

Nov. 11, 2013   (TW) .............................. 102140976 A

(51) Int. Cl.
*H01L 33/40* (2010.01)
*H01L 33/00* (2010.01)
*H01L 33/60* (2010.01)

(52) U.S. Cl.
CPC ......... *H01L 33/405* (2013.01); *H01L 33/0095* (2013.01); *H01L 33/60* (2013.01); *H01L 2933/0016* (2013.01)

(58) Field of Classification Search
None
See application file for complete search history.

(56) References Cited

U.S. PATENT DOCUMENTS 4,504,552 A * 3/1985 Kim .............................. 428/620

* cited by examiner

*Primary Examiner* — Matthew Reames
*Assistant Examiner* — Steven B Gauthier
(74) *Attorney, Agent, or Firm* — Patterson + Sheridan, LLP

(57) ABSTRACT

An optoelectronic device comprises a semiconductor stack, a first metal layer formed above the semiconductor stack, wherein the first metal layer comprises a first major plane and a first boundary with a gradually reduced thickness, and a second metal layer formed above the first metal layer, wherein the second metal layer comprise a second major plane paralleling to the first major plane and a second boundary with a gradually reduced thickness, and the second boundary of the second metal layer exceeds the first boundary of the first metal layer.

20 Claims, 9 Drawing Sheets

OPTOELECTRONIC DEVICE AND METHOD FOR MANUFACTURING THE SAME

CROSS REFERENCE TO RELATED APPLICATION

This application claims the priority to and the benefit of TW application Ser. No. 102140976 filed on Nov. 11, 2013, and the content of which is hereby incorporated by reference in its entirety.

BACKGROUND OF THE DISCLOSURE

1. Technical Field

This present application relates to an optoelectronic device, which is especially related to an electrode design of an optoelectronic device.

2. Description of the Related Art

The light radiation theory of light emitting diode (LED) is to generate light from the energy released by the recombination of the charge carriers between an n-type semiconductor and a p-type semiconductor. Because the light radiation theory of LED is different from the incandescent light which heats the filament, the LED is called a "cold" light source. Moreover, the LED is more sustainable, longevous, light and handy, and less power-consumption, therefore it is considered as an alternative light source for the illumination markets. The LED applies to various applications like the traffic signal, backlight module, street light, and medical instruments, and is gradually replacing the traditional lighting sources.

FIG. 1A shows the structure of a conventional light emitting device. As FIG. 1A shows, a light emitting device 100 which comprises a transparent substrate 10, a semiconductor stack 12 formed above the transparent substrate 10, and an electrode 14 formed above the semiconductor stack 12, wherein the semiconductor stack 12 comprises, from the top, a first conductive-type semiconductor layer 120, an active layer 122, and a second conductive-type semiconductor layer 124.

FIG. 1B shows the structure of a conventional light emitting device. As FIG. 1B shows, the light emitting device 100 comprises a transparent substrate 10, a semiconductor stack 12 formed above the transparent substrate 10, and an electrode 14 formed above the semiconductor stack 12, wherein the electrode 14 comprises a reflective electrode 141 and a diffusion barrier layer 142. The diffusion barrier may have some disadvantages concerning reflectivity. Therefore the light extraction efficiency of the light emitting device 100 is reduced.

Moreover, the light emitting device 100 may be further connected to other components in order to form a light emitting apparatus. FIG. 2 shows the structure of a conventional light emitting apparatus. As FIG. 2 shows, the light emitting apparatus 200 comprises a sub-mount 20 carrying at least an electrical circuit 202, a solder 22 formed above the sub-mount 20; wherein the light emitting device 100 is bonded to the sub-mount 20 and a substrate 10 of light emitting device 100 is electrically connected with the electric circuit 202 on the sub-mount 20 by the solder 22, and an electrical connection structure 24 that electrically connects the electrode 14 of the light emitting device 100 to the electric circuit 202 on the sub-mount 20, wherein the sub-mount 20 may be lead frame or large size mounting substrate in order to facilitate circuit design and heat dissipation.

SUMMARY OF THE DISCLOSURE

An optoelectronic device comprises a semiconductor stack, a first metal layer formed above the semiconductor stack, wherein the first metal layer comprises a first major plane and a first boundary with a gradually reduced thickness, and a second metal layer formed above the first metal layer, wherein the second metal layer comprise a second major plane parallel to the first major plane and a second boundary with a gradually reduced thickness, and the second boundary of the second metal layer exceeds the first boundary of the first metal layer.

DETAILED DESCRIPTION OF THE PREFERRED EMBODIMENTS

The embodiments of the present disclosure disclose a light emitting device and a fabrication method of the device. For a better understanding of the invention, reference is made to a detailed description to be read in conjunction with FIGS. 3A-7.

Figure 1A:
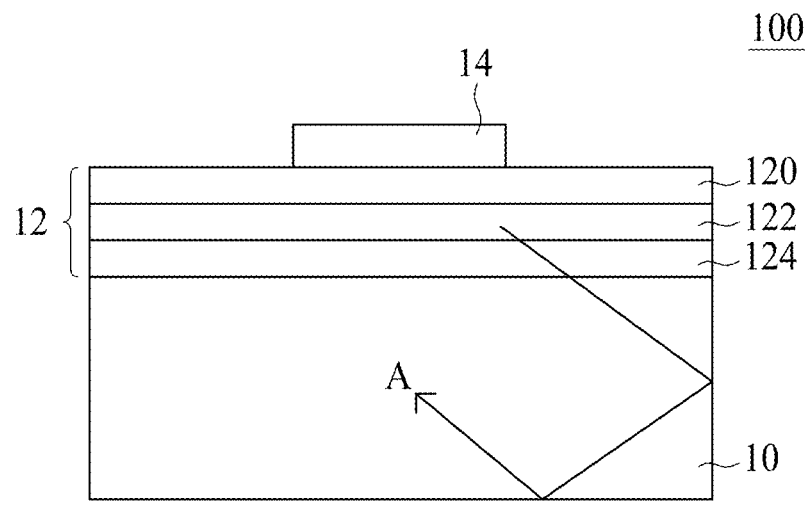
FIGS. 1A-1B show a side view of the structure of a conventional light emitting device.
Figure 1B:
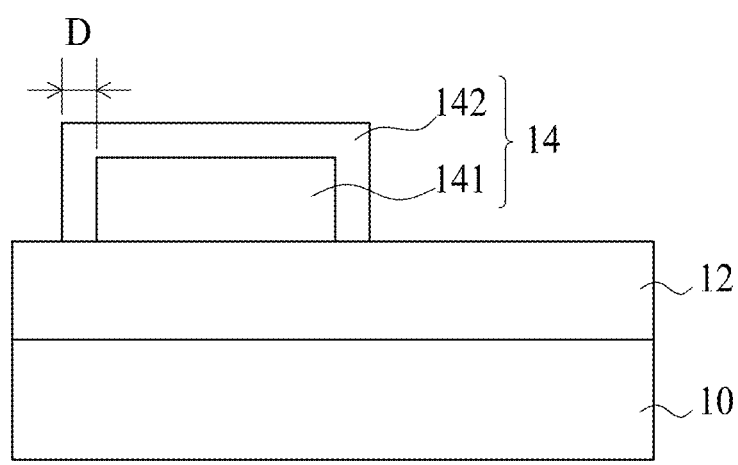
Figure 2:
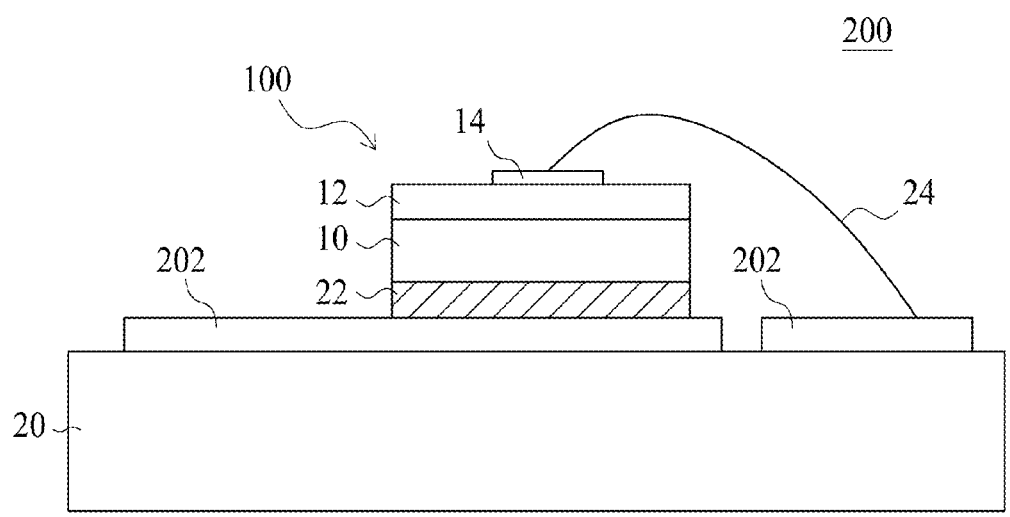
FIG. 2 shows the structure of a conventional light emitting apparatus.
Figure 3A:
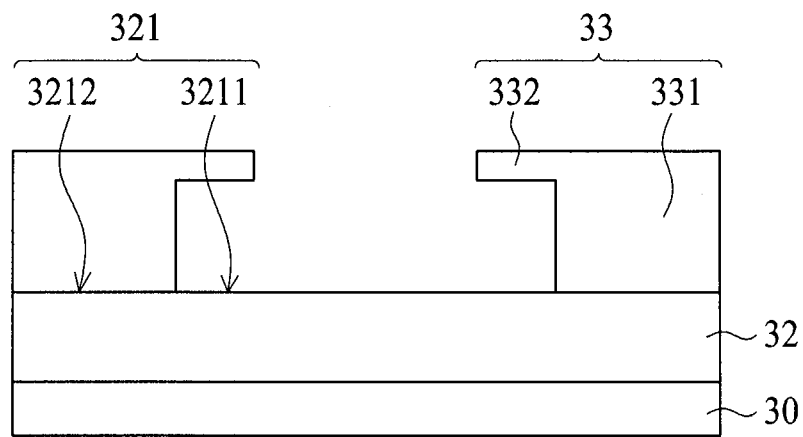
FIGS. 3A-3E show a process flow of fabricating a first embodiment of the present disclosure.

FIGS. 3A-3E show a process flow of fabricating a first embodiment of the present disclosure. As FIG. 3A shows, a substrate 30 is provided, a semiconductor epitaxial stack 32 is formed above the substrate 30, wherein the semiconductor epitaxial stack 32 comprises, from bottom up, a first conductive type semiconductor layer, an active layer, and a second conductive type semiconductor layer. The semiconductor epitaxial stack 32 further comprises an upper surface 321 not adjacent to the substrate 30, wherein the upper surface 321 comprises a first epitaxial region 3211 and a second epitaxial region 3212.

The substrate 30 serves as a growing and/or bearing foundation, which may be a conductive substrate or an insulative substrate, a transparent substrate or an opaque substrate, wherein the conductive substrate may be made of materials such as Ge, GaAs, InP, SiC, Si, $LiAlO_2$, ZnO, GaN, MN, and metal; the transparent substrate may be made of materials such as sapphire, $LiAlO_2$, ZnO, GaN, glass, diamond, CVD diamond, Diamond-Like Carbon (DLC), spinel ($MgAl_2O_4$), $SiO_x$, and $LiGaO_2$. The first conductive type semiconductor layer, the active layer and the second conductive type semiconductor may be made of materials comprising one or more elements selected from a group consisting of Ga, Al, In, As, P, N and Si, wherein the known materials are group III-V semiconductor such as AlGaInP series material, AlGaInN series material, and other series material such as ZnO.

Following, a photoresist layer 33 is formed above the upper surface 321 of the semiconductor epitaxial stack 32 and contacts directly the second epitaxial region 3212 of the upper surface 321. In the present embodiment, the photoresist layer 33 may comprise a first photoresist region 331 contacting directly the second epitaxial region 3212 and a second photoresist region 332 not contacting the semiconductor epitaxial stack 32. In other words, the photoresist layer 33 has an undercut pattern.

Figure 3B:
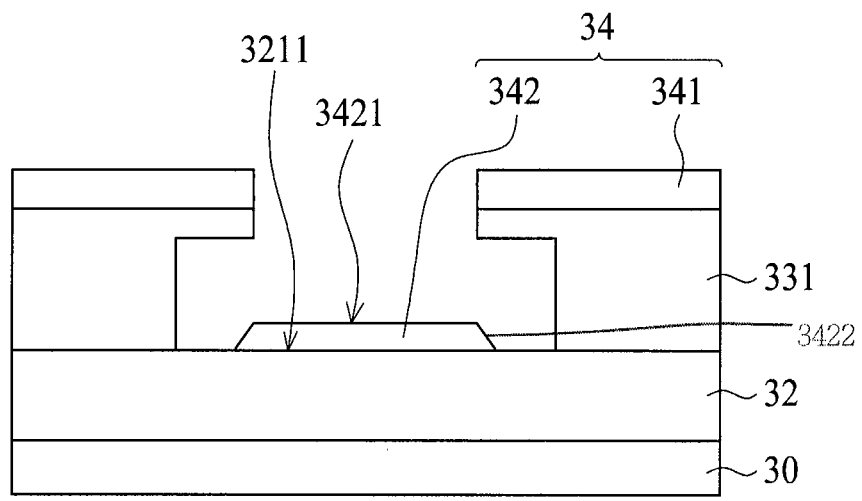

Following, as FIG. 3B shows, a first metal layer 34 is formed above the first epitaxial region 3211 and the photoresist layer 33 by physical vapor deposition (PVD), wherein the first metal layer 34 may comprise a first metal lower region 341 formed above the photoresist layer 33 and a second metal lower region 342 formed above the first epitaxial region 3211, wherein the second metal lower region 342 comprises a first major plane 3421 parallel to the upper surface 321 and the thickness of the boundary 3422 of the second metal lower region 342 is gradually reduced. The first metal layer may be made of material with reflectivity larger than 90%. In one embodiment, the first metal layer 34 may be metal material such as Ag, Rh, Pd, Al and Pt, or alloys thereof.

Figure 3C:
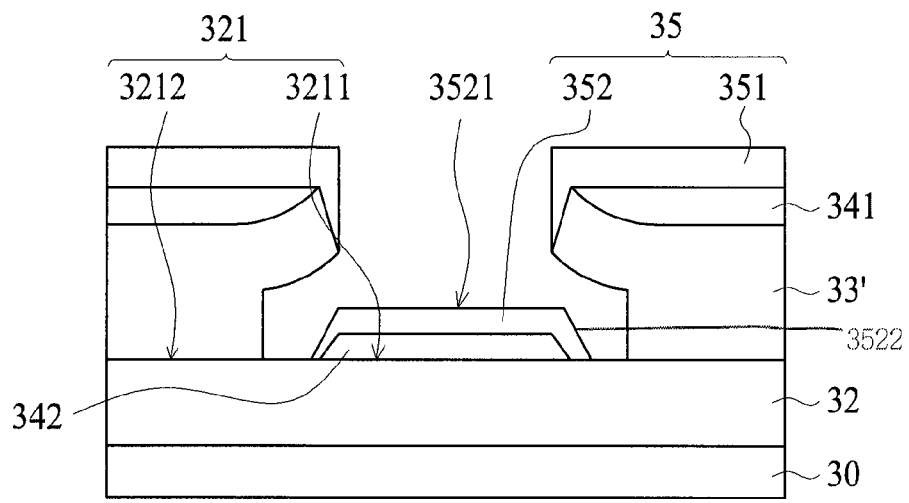

Following, as FIG. 3C shows, a second metal layer 35 is formed above the first metal layer 34 by using physical vapor deposition (PVD) such as evaporation or sputtering with the same photoresist layer 33, wherein the second metal layer 35 may comprise a first metal middle region 351 formed above the first metal lower region 341 and a second metal middle region 352 formed above the second metal lower region 342, wherein the second metal middle region 352 may comprise a second major plane 3521 parallel to the first major plane 3421, and the thickness of the boundary 3522 of the second metal middle region 352 is gradually reduced.

In present embodiment, because the material of the second metal layer 35 is a metal having higher or lower tensile strain than that of the first metal layer 34, the photoresist layer 33 bends as the thickness of the first metal middle region 351 increases during the deposition process. The amount of bending deflection of a bending photoresist layer 33' is proportional to the thickness of the first metal middle region 351. In one embodiment, the bending photoresist layer 33' may bend upward or downward. In one embodiment, the material of the second metal layer 35 may be Ti, V, Cr, Ni, Cu, Nb, Ru, Pd, W, or the alloys thereof. In one embodiment, the material of the second metal layer 35 may be Ni—Ti alloys.

In one embodiment, the bending photoresist layer 33' bends upward and make the boundary 3522 of the second metal middle region 352 exceed the boundary 3422 of the second metal lower region 342. In one embodiment, the minimum distance between the boundary 3522 of the second metal middle region 352 and the boundary 3422 of the second metal lower region 342 may be ranged from 3~10 µm.

Figure 3D:
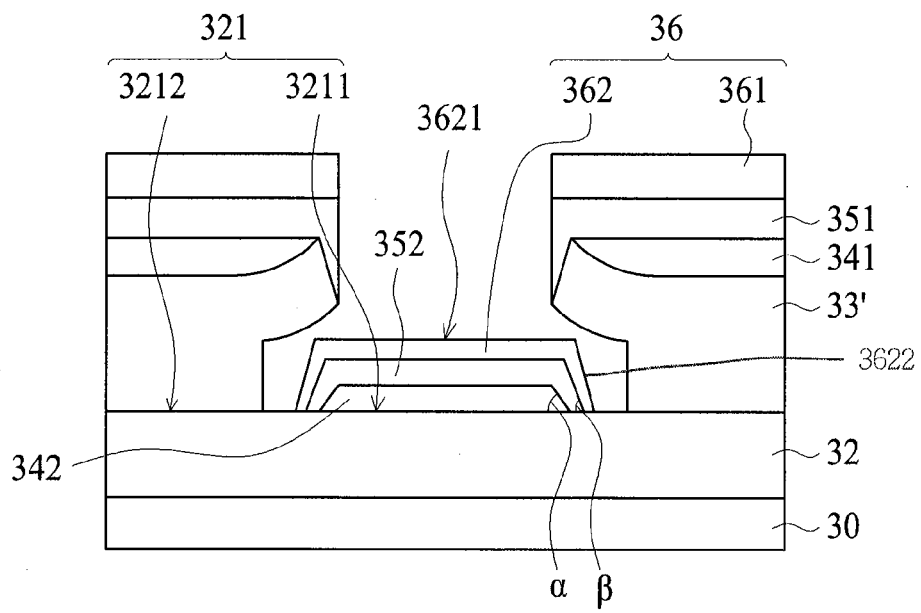

In another embodiment, as FIG. 3D shows, a third metal layer 36 is formed above the second metal layer 35 by selectively using physical vapor deposition (PVD) such as evaporation and sputtering with the photoresist layer 33', wherein the third metal layer 36 may comprise a first metal upper region 361 formed above the first metal middle region 351 and a second metal upper region 362 formed above the second metal middle region 352. The second metal upper region 362 may comprise a third major plane 3621 parallel to the second major plane 3521, wherein the thickness of the boundary 3622 of the second metal upper region 362 is gradually reduced. In one embodiment, the second metal layer 35 and/or the third metal layer 36 may function as a diffusion barrier. The reflectivity of the third metal layer 36 is smaller than the reflectivity of the second metal layer 35. As FIG. 3D shows, the boundary 3422 of the second metal lower region 342 and the boundary of the first epitaxial region 3211 form an angle α; the boundary 3522 of the second metal middle region 352 and the boundary of the first epitaxial region 3211 form an angle β, wherein α or β<10°.

Figure 3E:
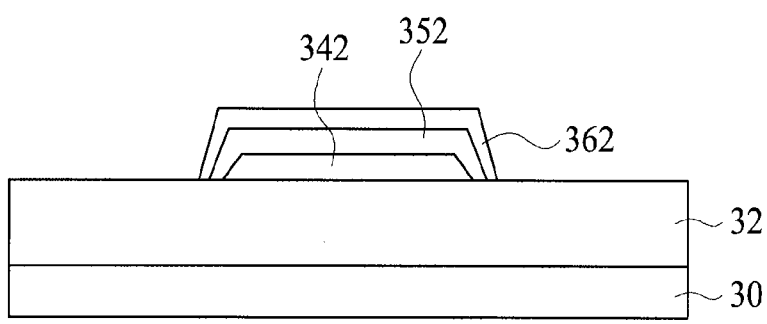

Finally, as FIG. 3E shows, an optoelectronic device 300 is then accomplished by removing the photoresist 33' and forming a second electrode (not shown in FIG. 3E) above the substrate 30 or the semiconductor epitaxial stack 32. In present disclosure, because the physical vapor deposition steps for the first metal layer 34, the second metal layer 35, and the third metal layer 36 use the same photoresist layer 33, the process can be simplified. Furthermore, because the second metal layer 35 can cause the deformation of the photoresist layer 33, the first metal layer 34, the second metal layer 35, and the third metal layer 36 may be formed by only one lithography process and maintain their functions as a reflective layer or a diffusion barrier. In other words, in the present disclosure, because the space reserved for alignment for two lithography processes is reduced, the saved space originally for alignment may be used to enlarge the area of the first metal layer 34 to increase the reflection region and reduce the deposition region of the second metal layer 35 which has lower reflectivity to reduce the light absorption so the light extraction efficiency of the optoelectronic device 300 is increased.

Figure 4A:
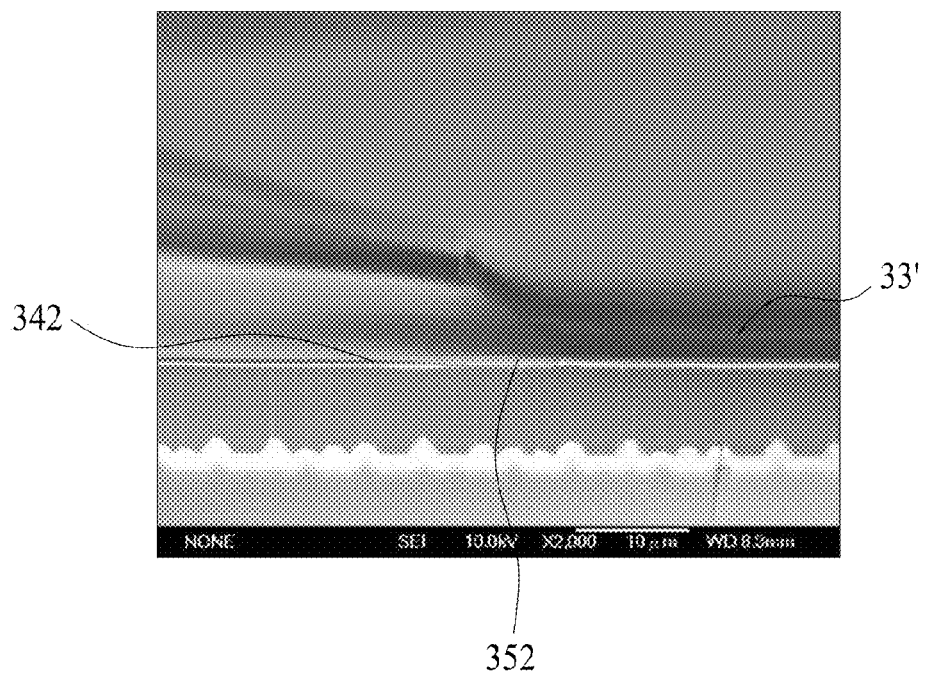
FIGS. 4A-4B show two scanning electron microscope (SEM) images of the electrode design of the present disclosure.
Figure 4B:
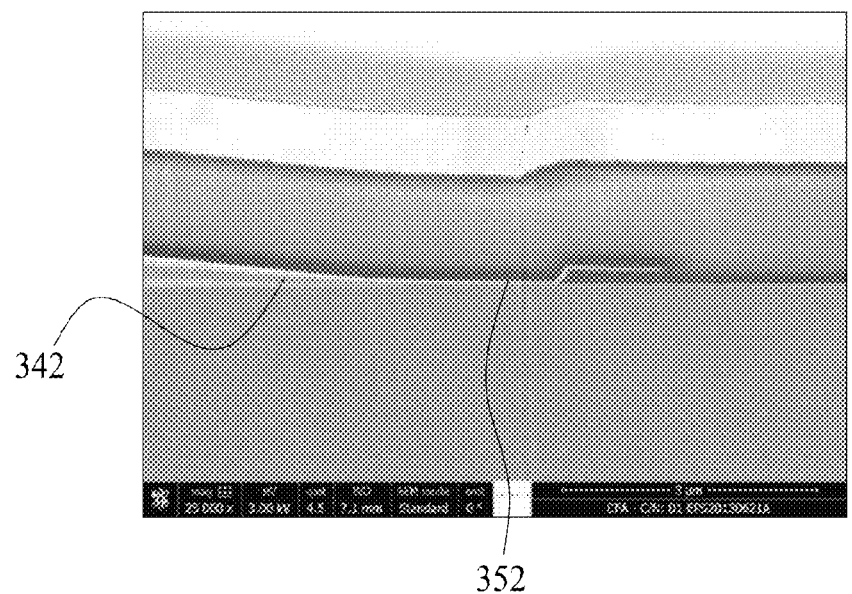

FIGS. 4A-4B show scanning electron microscope (SEM) images of the electrode design disclosed in the present disclosure. As FIG. 4A shows, by following the process of the present disclosure, the photoresist layer 33' bends upward and makes the boundary 3522 of the second metal middle region 352 exceed the boundary 3422 of the second metal lower region 342. FIG. 4B, which is the enlarged photo of FIG. 4A, can be seen more clearly that the deposition boundary 3522 of the second metal middle region 352 exceeds the boundary 3422 of the second metal lower region 342.

Figure 5A:
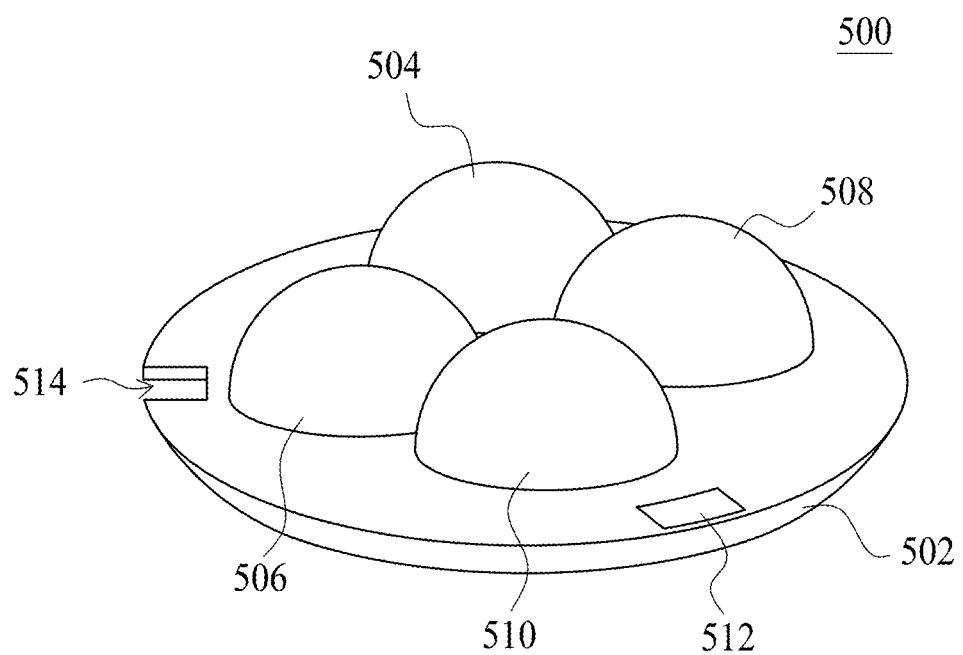
FIGS. 5A-5C show a light emitting module of the present disclosure.
Figure 5B:
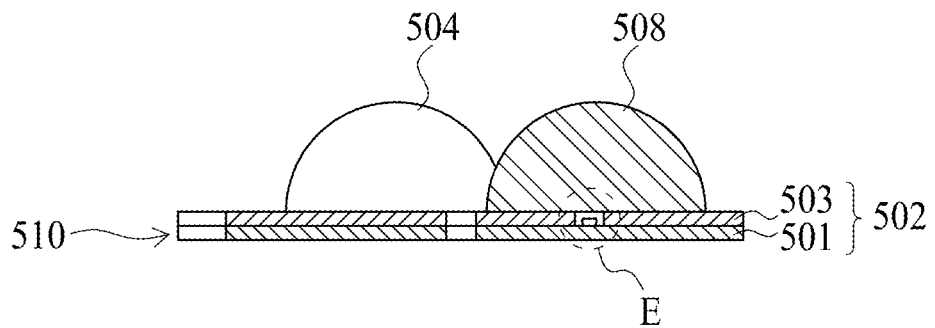
Figure 5C:
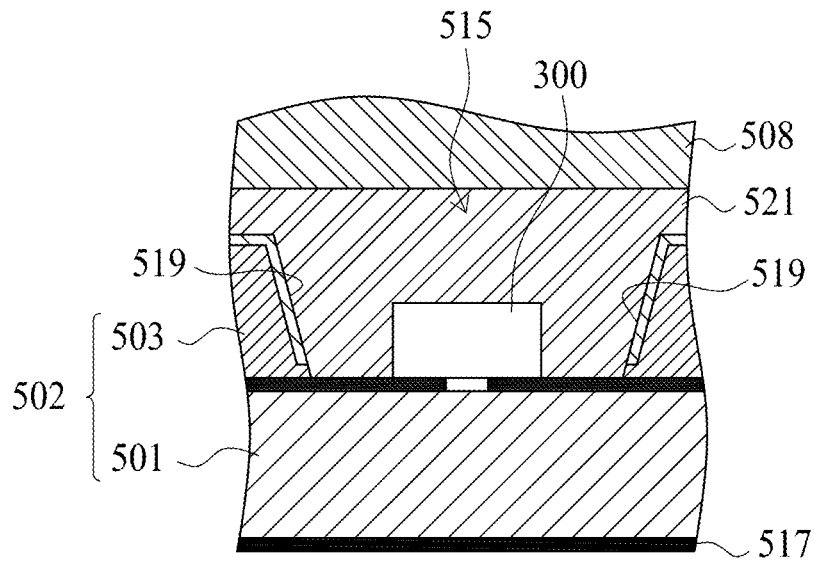

FIGS. 5A~5C show a light emitting module disclosed in the present disclosure. FIG. 5A shows perspective view of a light emitting module 500 which comprise a carrier 502, a light emitting device as any one of embodiments in present disclosure (not shown), a plurality of optical lenses 504, 506, 508, and 510, and two power supply terminators 512 and 514.

FIGS. 5B~5C show cross-sectional views of a light emitting module, wherein FIG. 5C is an enlarged view of the region E of FIG. 5B. As FIG. 5C shows, the carrier 502 may comprise an upper carrier 503 and a lower carrier 501, wherein a surface of the lower carrier 501 may contact the upper carrier 503, and the optical lenses 504 and 508 may be formed above the upper carrier 503. The upper carrier 503 may contain a through hole 515, wherein the light emitting device 300 may be formed in the through hole 515, contact the lower carrier 501, and surrounded by adhesive materials 521. The optical lens 508 is formed above the adhesive materials 521.

In one embodiment, a reflective layer 519 is formed on the side wall of the through hole 515 to enhance the light emitting efficiency of the light emitting device 300; a metal layer 517 is formed on a lower surface of the lower carrier 501 to enhance heat dissipation.

Figure 6A:
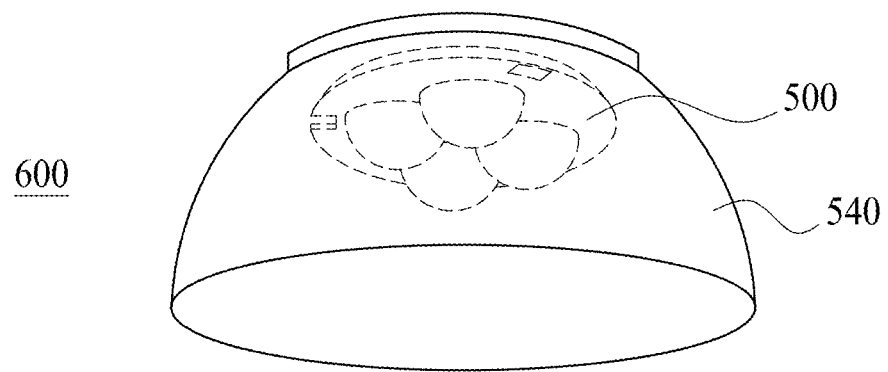
FIGS. 6A-6B show a light emitting apparatus of the present disclosure.
Figure 6B:
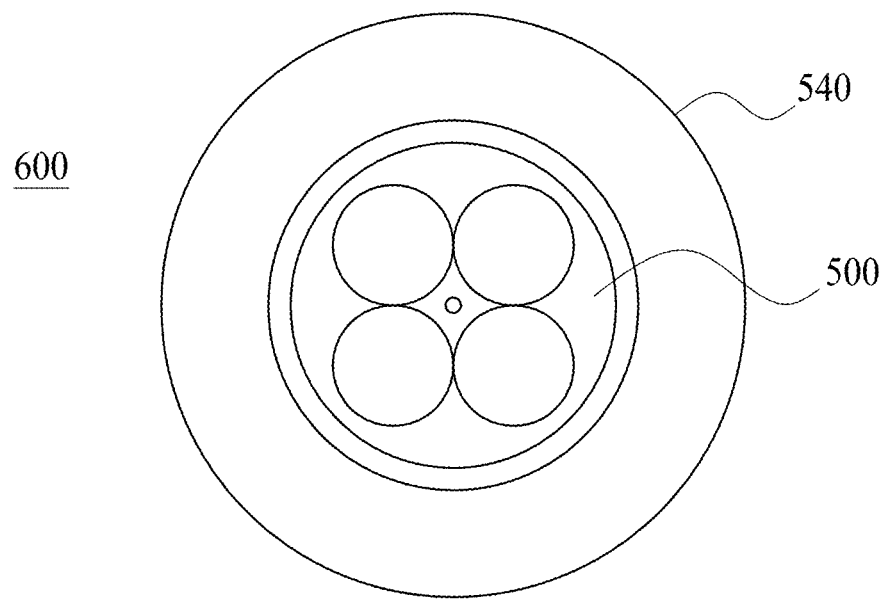

FIGS. 6A~6B show a light emitting apparatus 600 disclosed in the present disclosure. The light emitting apparatus 600 may comprise the light emitting module 500, a shell 540 and a power supply system (not shown) to supply the light emitting module 600 a current, and a control device (not shown) to control the power supply system (not shown). The light emitting apparatus 600 may be an illuminator such as street lights, automobile lightings or indoor lightings, or it may also be traffic lights or a backlight of a backlight module in a flat panel display.

Figure 7:
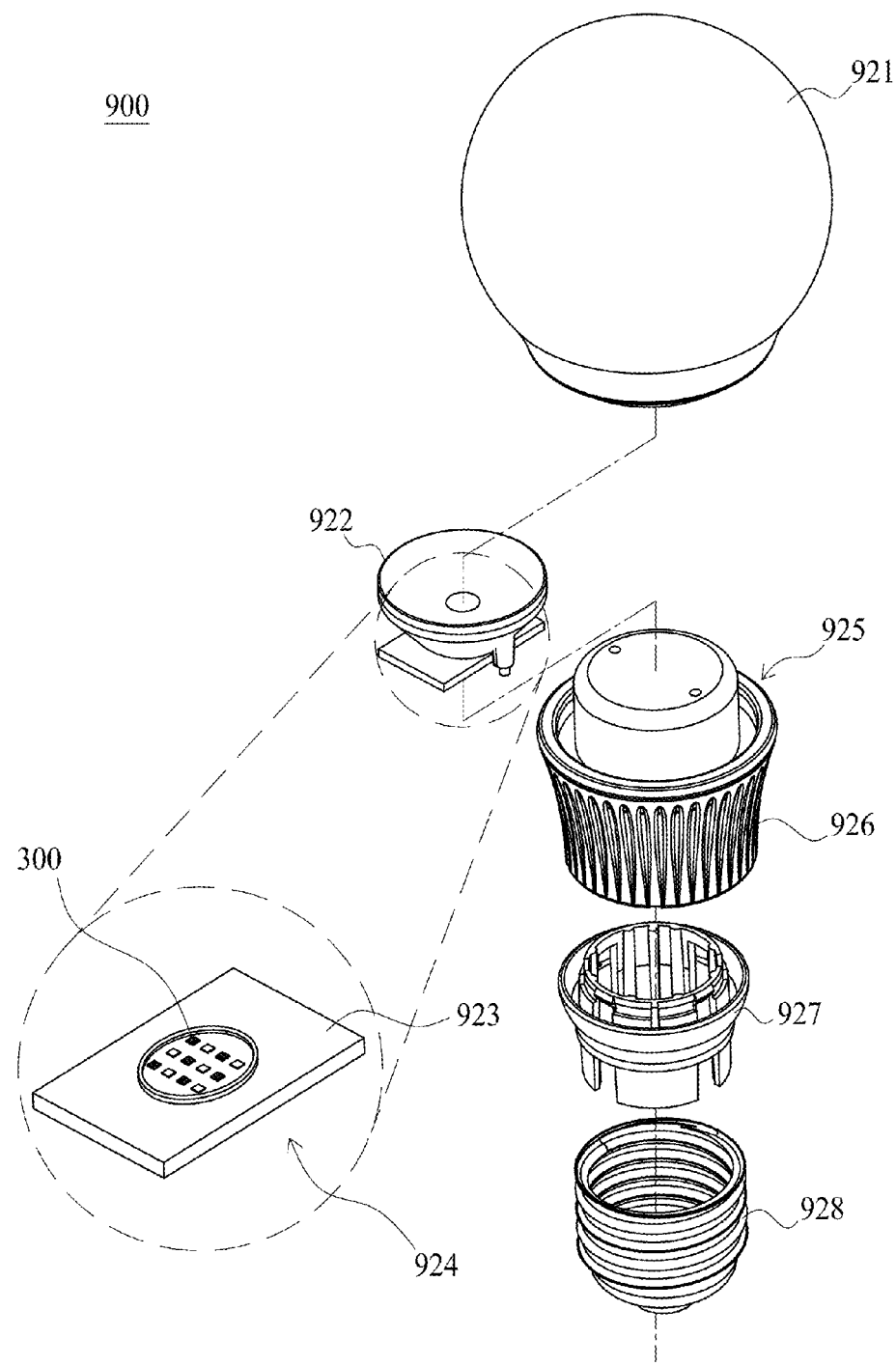
FIG. 7 shows a light bulb of the present disclosure.

FIG. 7 shows a light bulb disclosed in the present disclosure. A light bulb 900 may comprise a shell 921, a lens 922, a lighting module 924, a stand 925, a heat dissipater 926, a connector 927 and an electrical connector 928, wherein the lighting module 924 comprises a carrier 923 and an optoelectronic device 300 disclosed in any one of the embodiments in present disclosure.

In one embodiment, a buffer layer (not shown) may be selectively formed between the semiconductor epitaxial layer 32 and the substrate 30. The material of the buffer layer is between two material systems to transit the material system of the substrate 30 to the material system of the semiconductor epitaxial layer 32. For the structure of the light emitting diode, on one hand, the buffer layer may be used to reduce lattice mismatch between two materials; on the other hand, the buffer layer may be used to bond together two materials or two separated structures such as single layers, multiple layers or structures, wherein the materials may be organic materials, inorganic materials, metals, semiconductors, and etc., wherein the structures may be reflective layers, heat dissipation layers, conductive layers, ohmic contact layers, anti-deformation layers, stress release layers, stress adjustment layers, binding layers, wavelet transform layers, mechanical fixation structures, and etc.

A contact layer may be further optionally formed on the semiconductor epitaxial layer 32. The contact layer is arranged on the side of the semiconductor epitaxial layer 32 away from the substrate 30. The contact layer may be an optical layer, an electrical layer, or the combination thereof. The optical layer may change the radiation or light coming in or out from the active layer. The so-called "change" means to alter at least one of the optical characteristics of the radiation or light. These characteristics include but are not limited to frequency, wavelength, intensity, flux, efficiency, color temperature, rendering index, light field, and angle of view. The electrical layer may change or incline to change at least one numerical value of the voltage, resistance, current, capacity measured between any combinations of the contact layers. The material of the contact layer may comprise one of the materials such as oxide, conductive oxide, transparent oxide, or metal, organic, inorganic, fluorescence, phosphorescence, ceramic materials, semiconductor, doped semiconductor, or undoped semiconductor. In certain applications, the material of the contact layer may be one of the materials such as InTiO, CdSnO, SbSnO, InZnO, ZnAlO or ZnSnO. If the material of the contact layer is transparent metal, the thickness of the contact layer is in a range between 0.005 µm to 0.6 µm. In one embodiment, because the contact layer has better lateral current diffusion rate, it may be used to spread the current into the semiconductor epitaxial layer 32 evenly. Generally, according to different dopants and processes of the contact layer, the bandgap may be ranged from 0.5 eV to 5 eV.

Although the drawings and the illustrations shown above are corresponding to the specific embodiments individually, the element, the practicing method, the designing principle, and the technical theory can be referred, exchanged, incorporated, collocated, coordinated except they are conflicted, incompatible, or hard to be put into practice together. Although the present application has been explained above, it is not the limitation of the range, the sequence in practice, the material in practice, or the method in practice. Any modification or decoration for present application is not detached from the spirit and the range of such.

The invention claimed is:

1. A method of fabricating an optoelectronic device, comprising:
    providing a semiconductor stack;
    forming a photoresist layer with an undercut pattern above the semiconductor stack, wherein the photoresist layer comprises an opening in order to expose the semiconductor stack, wherein the photoresist layer comprises a deformation including an upward deformation;
    forming a first metal layer above the semiconductor stack and the photoresist layer, wherein the first metal layer above the semiconductor stack comprise a first major plane and a first boundary; and
    forming a second metal layer above the first metal layer, semiconductor stack and the photoresist layer, wherein the second metal layer above the first metal layer and the semiconductor stack comprises a second major plane and a second boundary, wherein the second boundary exceeds the first boundary.

2. The method of claim 1, wherein the deformation increases with the thickness of the second metal layer.

3. The method of claim 1, wherein the semiconductor stack comprises a first semiconductor layer, an active layer, and a second semiconductor layer, wherein the first semiconductor layer, the second semiconductor layer and the active layer comprise material of III-V semiconductor including AlGaInP series, and AlGaInN series, or the group of ZnO series.

4. A method of fabricating an optoelectronic device, comprising:
    providing a semiconductor stack;
    forming a photoresist layer with an undercut pattern above the semiconductor stack, wherein the photoresist layer comprises an opening in order to expose the semiconductor stack;
    forming a first metal layer above the semiconductor stack and the photoresist layer, wherein the first metal layer above the semiconductor stack comprise a first major plane and a first boundary, wherein the first metal layer comprises Ag, Rh, Pd, Al, Pt, or alloys thereof; and
    forming a second metal layer above the first metal layer, semiconductor stack and the photoresist layer, wherein the second metal layer above the first metal layer and the semiconductor stack comprises a second major plane and a second boundary, wherein the second boundary exceeds the first boundary.

5. The method of claim 1, wherein the reflectivity of the first metal layer is larger than 90%.

6. The method of claim 1, wherein the second metal layer comprises a metal having higher or lower tensile strain than that of the material of the first metal layer, and comprises Ti, V, Cr, Ni, Cu, Nb, Ru, Pd, or alloys thereof.

7. A method of fabricating an optoelectronic device, comprising:
    providing a semiconductor stack;
    forming a photoresist layer with an undercut pattern above the semiconductor stack, wherein the photoresist layer comprises an opening in order to expose the semiconductor stack;
    forming a first metal layer above the semiconductor stack and the photoresist layer, wherein the first metal layer above the semiconductor stack comprise a first major plane and a first boundary;
    forming a second metal layer above the first metal layer, semiconductor stack and the photoresist layer, wherein the second metal layer above the first metal layer and the semiconductor stack comprises a second major plane and a second boundary, wherein the second boundary exceeds the first boundary; and further forming a third metal layer above the first metal layer, the second metal layer, the semiconductor stack, and the photoresist layer, wherein the third metal layer above the first metal layer, the second metal layer, the semiconductor stack comprises a third major plane and a third boundary, wherein the third boundary exceeds the second boundary.

8. The method of claim 7, wherein the third metal layer functions as a metal diffusion barrier.

9. The method of claim 7, wherein the reflectivity of the third metal layer is smaller than the reflectivity of the first metal layer.

10. The method of claim 1, wherein the first boundary or the second boundary comprises a gradually reduced thickness.

11. The method of claim 1, wherein the first metal layer comprises Ag, Rh, Pd, Al, Pt, or alloys thereof.

12. The method of claim 1, further forming a third metal layer above the first metal layer, the second metal layer, the semiconductor stack, and the photoresist layer, wherein the third metal layer above the first metal layer, the second metal layer, the semiconductor stack comprises a third major plane and a third boundary, wherein the third boundary exceeds the second boundary.

13. The method of claim 4, wherein the first boundary or the second boundary comprises a gradually reduced thickness.

14. The method of claim 4, wherein the semiconductor stack comprises a first semiconductor layer, an active layer, and a second semiconductor layer, wherein the first semiconductor layer, the second semiconductor layer and the active layer comprise material of III-V semiconductor including AlGaInP series, and AlGaInN series, or the group of ZnO series.

15. The method of claim 4, wherein the reflectivity of the first metal layer is larger than 90%.

16. The method of claim 4, wherein the second metal layer comprises a metal having higher or lower tensile strain than that of the material of the first metal layer, and comprises Ti, V, Cr, Ni, Cu, Nb, Ru, Pd, or alloys thereof.

17. The method of claim 7, wherein the semiconductor stack comprises a first semiconductor layer, an active layer, and a second semiconductor layer, wherein the first semiconductor layer, the second semiconductor layer and the active layer comprise material of III-V semiconductor including AlGaInP series, and AlGaInN series, or the group of ZnO series.

18. The method of claim 7, wherein the reflectivity of the first metal layer is larger than 90%.

19. The method of claim 7, wherein the second metal layer comprises a metal having higher or lower tensile strain than that of the material of the first metal layer, and comprises Ti, V, Cr, Ni, Cu, Nb, Ru, Pd, or alloys thereof.

20. The method of claim 7, wherein the first metal layer comprises Ag, Rh, Pd, Al, Pt, or alloys thereof.

* * * * *